(12) United States Patent
Shu

(10) Patent No.: US 8,019,312 B2
(45) Date of Patent: *Sep. 13, 2011

(54) DC OFFSET CALIBRATION FOR A RADIO TRANSCEIVER MIXER

(75) Inventor: Tzi-Hsiung Shu, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/544,499

(22) Filed: Aug. 20, 2009

(65) Prior Publication Data

US 2009/0318095 A1 Dec. 24, 2009

Related U.S. Application Data

(60) Continuation of application No. 11/414,296, filed on May 1, 2006, now Pat. No. 7,596,362, which is a division of application No. 09/858,812, filed on May 15, 2001, now Pat. No. 7,039,382.

(51) Int. Cl.
*H04B 1/10* (2006.01)
*H04B 1/26* (2006.01)
*H04B 15/00* (2006.01)

(52) U.S. Cl. ......... 455/313; 455/284; 455/296; 455/326

(58) Field of Classification Search .............. 455/296, 455/313–326, 333, 284
See application file for complete search history.

(56) References Cited

U.S. PATENT DOCUMENTS

| | | | | |
|---|---|---|---|---|
| 4,717,894 A | * | 1/1988 | Edwards et al. | 332/144 |
| 5,119,399 A | * | 6/1992 | Santos et al. | 375/224 |
| 5,303,417 A | * | 4/1994 | Laws | 455/314 |
| 5,471,665 A | * | 11/1995 | Pace et al. | 455/343.2 |
| 5,712,637 A | | 1/1998 | Lindquist et al. | |
| 5,901,349 A | | 5/1999 | Guegnaud et al. | |
| 5,995,819 A | | 11/1999 | Yamaji et al. | |
| 6,006,079 A | | 12/1999 | Jaffee et al. | |
| 6,037,825 A | | 3/2000 | Kung | |
| 6,057,714 A | | 5/2000 | Andrys et al. | |
| 6,222,878 B1 | * | 4/2001 | McCallister et al. | 375/225 |
| 6,226,509 B1 | | 5/2001 | Mole et al. | |
| 6,321,076 B1 | | 11/2001 | Jianqin | |
| 6,324,388 B1 | | 11/2001 | Souetinov | |
| 6,377,315 B1 | | 4/2002 | Carr et al. | |
| 6,421,398 B1 | * | 7/2002 | McVey | 375/308 |
| 6,429,733 B1 | | 8/2002 | Pagliolo et al. | |

(Continued)

OTHER PUBLICATIONS

Jan Crols, Student Member, IEEE and Michel S.J. Steyaert, Senior Member, IEEE, "A 1.5 GHz Highly Linear CMOS Downconversion Mixer," IEEE Journal of Solid-State Circuits, vol. 30, No. 2, Jul. 1995, pp. 736-742.

(Continued)

*Primary Examiner* — Simon Nguyen
(74) *Attorney, Agent, or Firm* — Sterne, Kessler, Goldstein & Fox P.L.L.C.

(57) ABSTRACT

An apparatus, method, and system for DC offset cancellation are provided herein. For instance, the apparatus can include a first commutating mixer switch and a second commutating mixer switch. The first commutating mixer switch can have a first input port configured to receive a first differential signal and a first differential output port. The second commutating mixer switch can have a second input port configured to receive a second differential offset signal and a second differential output port. The first and second differential output ports can be coupled to one another to provide a combined differential output signal.

20 Claims, 3 Drawing Sheets

U.S. PATENT DOCUMENTS

| | | | |
|---|---|---|---|
| 6,529,719 | B1 | 3/2003 | Imbornone et al. |
| 6,535,725 | B2 * | 3/2003 | Hatcher et al. ............... 455/317 |
| 6,625,424 | B1 | 9/2003 | Mohindra |
| 6,636,730 | B2 | 10/2003 | Spargo et al. |
| 6,654,595 | B1 * | 11/2003 | Dexter ......................... 455/323 |
| 6,687,494 | B1 | 2/2004 | Mourant |
| 6,704,558 | B1 | 3/2004 | Sorrells et al. |
| 6,711,396 | B1 | 3/2004 | Bergsma et al. |
| 6,725,024 | B1 * | 4/2004 | Lindoff et al. ................ 455/255 |
| 6,735,422 | B1 * | 5/2004 | Baldwin et al. ............ 455/232.1 |
| 6,738,601 | B1 | 5/2004 | Rofougaran et al. |
| 6,804,497 | B2 * | 10/2004 | Kerth et al. ..................... 455/88 |
| 6,816,712 | B2 | 11/2004 | Otaka et al. |
| 6,947,720 | B2 | 9/2005 | Razavi et al. |
| 6,960,962 | B2 * | 11/2005 | Peterzell et al. ................ 331/40 |
| 7,039,382 | B2 | 5/2006 | Shu |
| 7,295,823 | B2 * | 11/2007 | Simmons et al. .......... 455/234.1 |
| 2006/0194560 | A1 | 8/2006 | Shu |

OTHER PUBLICATIONS

Hooman Darabi and Asad A. Abidi, Fellow, IEEE, "A 4.5-mW 900-MHz CMOS Receiver for Wireless Paging," IEEE Journal of Solid-State Circuits, vol. 35, No. Aug. 2000, pp. 1085-1096.

Paolo Orsatti, Member, IEEE, Francesco Piazza, Associate Member, IEEE and Quitting Huang, Seinor Member, IEE, "A 20-mA-Receive, 55-mA-Transmit, Single-Chip GSM Transceiver in 0.25-.mu.m CMOS," IEEE Journal of Solid-State Circuits, vol. 34, No. 12, Dec. 1999, pp. 1869-1880.

Aarno Parssinen, Student Member, IEEE, Jarkko Jussila, Student Member, IEEE, Jussi Ryynanen, Student Member, IEEE, Lauri Sumanen, Student Member, IEEE, and Kari A.I. Halonen, A 2-GHz Wide-Band Direct Conversion Receiver for WCDMA Applications, IEEE Journal of Solid-State Circuits, vol. 34, No. 12 Dec. 1999, pp. 1893-1903.

Behzad Razavi, "A 2.4-ghZ cmos Receiver for IEEE 802.11 Wireless LNA's," IEEE Journal of Solid-State Circuits, vol. 34, No. 10, Oct. 1999, pp. 1382-1385.

Joo Leong (Julian) Tham, Member, IEEE, Mihai a. Margarit, Bernd Pregardier, Member, IEEE, Christopher D. Hull, Rahul Magoon, Member, IEEE, and Frank Carr, "A 2.7-V 900-MHz/1.9-GHz Dual-Band Transceiver IC for Digital Wireless Communication," IEEE Journal of Solid-State Circuits, vol. 34, No. 3, Mar. 1999, pp. 286-291.

* cited by examiner

DC OFFSET CALIBRATION FOR A RADIO TRANSCEIVER MIXER

CROSS REFERENCE TO RELATED APPLICATIONS

This application is a continuation of pending U.S. patent application entitled "DC Offset Calibration for a Radio Transceiver Mixer," Ser. No. 11/414,296, filed May 1, 2006 (now allowed), which is a divisional of U.S. patent application entitled "DC Offset Calibration for a Radio Transceiver Mixer," Ser. No. 09/858,812, filed May 15, 2001 (now U.S. Pat. No. 7,039,382), which are both incorporated herein by reference in their entireties.

BACKGROUND

1. Field of Invention

This invention relates in general to radio frequency (RF) transceivers and more particularly to mixers used in RF transceivers that provide DC offset calibration.

2. Related Art

An RF transceiver (transmitter/receiver) typically requires a frequency translation function, in which a signal is translated from one carrier frequency, $\omega_1$, to another frequency, $\omega_2$. The translation is carried out by what is known as a "mixer." In effect, a mixer translates the center frequency, $\omega_1$, of a signal band, to a center frequency, $\omega_2$, by mixing the signal band with a local oscillator signal having a frequency of $\omega_{LO}$, where $\omega_{LO}=(\omega_1-\omega_2)$. The mixing operation yields a first band centered around $\omega_2$ and a second band centered around $2\omega_1-\omega_2$. An appropriate filter is then typically employed to select the desired signal band centered around $\omega_2$. When $\omega_1>\omega_2$, this operation is known in the art as downconversion mixing. On the other hand, when $\omega_1<\omega_2$, the operation is known as upconversion mixing.

Crols and M. S. J. Steyaert, "A 1.5 GHz Highly Linear CMOS Downconversion Mixer", *IEEE J Solid-State Circuits*, vol. 30, pp. 736-742, July 1995 disclose a mixer design in which MOS transistors, operating in their linear region, are used as voltage-dependent resistors to modulate a signal. The impedance of the transistors in the linear region is controlled by the input signal to be modulated. Local oscillator signals are provided to the source/drain side of the transistors. There are certain weaknesses with this design, however. First, the linearity of the mixer is limited in that the impedance of the MOS transistors in the linear region become non-linear when the gate control voltage varies considerably. Second, the gain of the mixer is not well controlled, since it is difficult to match the impedance of the MOS transistors in the linear region to that of the resistor in the feedback loop of the amplifier. Finally, even if additional sets of MOS transistors are included for the DC offset cancellation path, mismatch of the transistors can be of a concern, especially if different signal path gains are to be implemented.

A typical transceiver is subject to other known non-idealities, which can yield an undesirable output. One such non-ideality relates to a direct current (DC) component, which is often introduced into the input signal of an upconversion mixer. If the desired input signal is centered around DC, the extra DC component introduced into the input signal will corrupt the signal and degrade the signal quality. The DC component, after mixing with the local oscillator (LO), generates an undesired tone at $\omega_{LO}$ at the output of the mixer.

Another example of non-ideality relates to LO feedthrough and self-mixing in a downconversion mixer, in which the LO signal is coupled into the input signal and subsequently is mixed with the LO itself in the mixer, producing an undesirable DC component.

BRIEF SUMMARY

The present invention pertains to a mixer design for radio transceivers, which includes a calibration scheme for reducing DC offsets caused by various non-ideal effects in the transceiver.

In a first aspect of the present invention a mixer for a radio transceiver comprises a commutating mixer switch having a first differential input port. The first differential input port includes a first terminal coupled to a first end of a first resistor and a second terminal coupled to a first end of a second resistor. Second ends of the first and second resistors are configured to receive a differential input signal. According to this aspect of the invention, a DC offset cancellation path may further comprise a third resistor having a first end coupled to the first terminal of the first differential input port, and a fourth resistor having a first end coupled to the second terminal of the first differential input port, such that second ends of the third and fourth resistors are configured to receive a DC calibration signal.

In a second aspect of the invention, an image-reject mixer comprises a first commutating mixer switch having a first differential input port, a second differential input port for accepting a first local oscillator signal and a differential output port. A first resistor has a first end coupled to one of the terminals of the first differential input port of the first commutating mixer switch and has a second end. A second resistor having substantially the same resistance value as the first resistor has a first terminal coupled to the other terminal of the first differential input port and has a second end. A second commutating mixer switch has a first differential input port, a second differential input port for accepting a second local oscillator signal that is ninety degrees out of phase with the first oscillator signal and a differential output port. A third resistor having substantially the same resistance value as the first resistor has a first end coupled to one of the terminals of the first differential input port of the second commutating mixer switch and has a second end. A fourth resistor having substantially the same resistance value as the first resistor has a first end coupled to the other terminal of the first differential input port of the second commutating mixer switch and a second end. The second ends of the first and second resistors are configured to receive a first differential input signal, the second ends of the third and fourth resistors are configured to receive a second differential input signal that is ninety degrees out of phase with the first differential input signal, and the differential output port of the first commutating mixer switch is coupled to the differential output port of the second commutating mixer switch.

In a third aspect of the present invention, an image-reject mixer comprises an in-phase commutating mixer switch, which receives a first resistively coupled differential input signal, and a quadrature phase commutating mixer switch, which receives a second resistively coupled differential input signal. The in-phase commutating mixer switch modulates the first resistively coupled input signal with a first local oscillator signal and the quadrature phase commutating mixer modulates the second resistively coupled input signal with a second local oscillator signal, which is ninety degrees out of phase with the first local oscillator signal. The in-phase commutating mixer switch has a differential output, which is coupled to a differential output of the quadrature commutating mixer switch.

A further understanding of the nature and advantages of the inventions herein may be realized by reference to the remaining portions of the specification and the attached drawings.

BRIEF DESCRIPTION OF THE DRAWINGS/FIGURES

DETAILED DESCRIPTION

Figure 1:
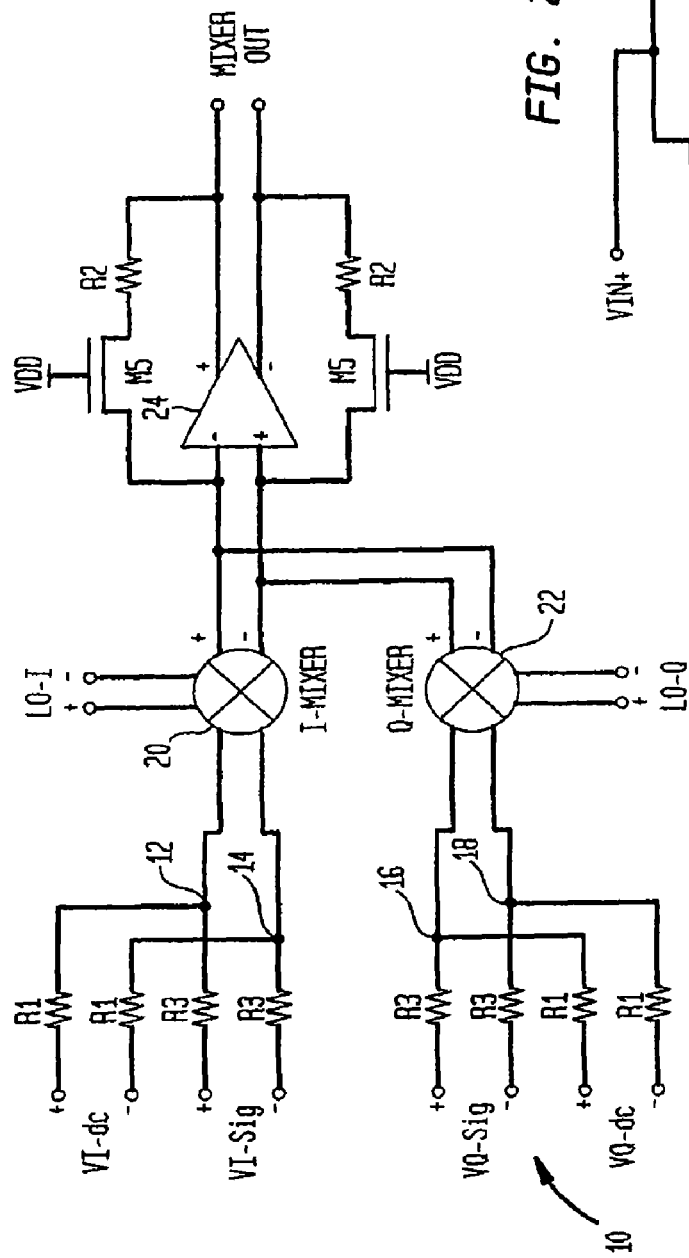
FIG. 1 shows an exemplary image reject mixer, according to an embodiment of the present invention.
Figure 2:
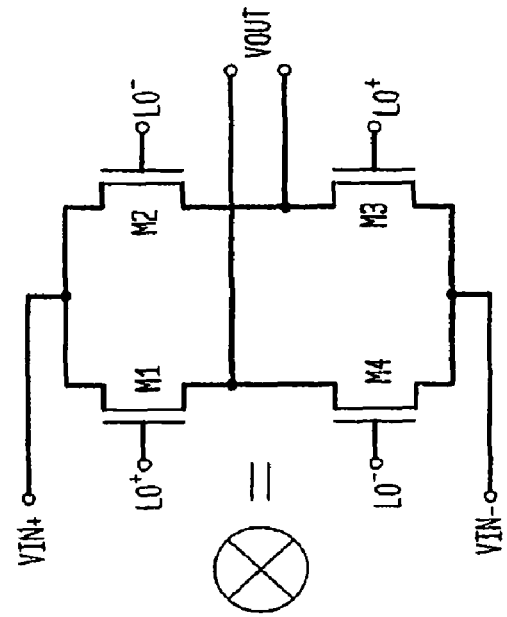
FIG. 2 shows a commutating mixer switch, which can be used for each of the in-phase and quadrature phase commutating mixer switches in the image-reject mixer shown in FIG. 1.

Referring to FIG. 1, there is shown an exemplary embodiment of an image reject mixer 10 according to an embodiment of the present invention. Resistors R1 (each R1 has the same resistance value) are configured to receive differential offset compensation signals, VI-dc and VQ-dc, and resistors R3 (each R3 has the same resistance value) are configured to receive main signals, VI-sig and VQ-sig, where "I" and "Q" indicate an in-phase channel and an quadrature phase channel, respectively. Unlike the prior art, with the use of the resistors, rather than reliance upon the on resistance of MOS transistors, the linearity of image-reject mixer 10 is superior. Resistors R3 function to convert the signals VI-sig and VQ-sig into currents, and resistors R1 function to convert VI-dc and VQ-dc into currents, which are summed at nodes 12, 14, 16 and 18. Resistors R1 are selected to provide a DC offset cancellation path. An in-phase commutating mixer switch 20 is configured to receive the differential current signal from nodes 12 and 14, which are then modulated by an in-phase local oscillator signal, LO-I. Similarly, a quadrature phase commutating mixer switch 22 is configured to receive the differential current signal from nodes 16 and 18, which are then modulated by a quadrature phase (i.e. 90 degrees out-of-phase) local oscillator signal, LO-Q. An exemplary embodiment of a commutating mixer switch, which can be used for each of the in-phase 20 and quadrature phase 22 commutating mixer switches, is shown in FIG. 2.

As shown in FIG. 1, the differential outputs of in-phase 20 and quadrature phase 22 commutating mixer switches are connected together and input into an operational amplifier 24. The positive end of the differential output of operational amplifier 24 is fed back to the inverting input of operational amplifier 24 and the negative end of the differential output of operational amplifier 24 is fed back to the non-inverting input of operational amplifier 24.

Each of the feedback loops of operational amplifier 24 contains a resistor R2 (each R2 has the same resistance value) and a MOS transistor M5 (each M5 has substantially the same physical and electrical characteristics). The gates of both MOS transistors M5 are coupled to a power supply, VDD, so that they remain on and present themselves as resistive components. Also, the physical and material characteristics of both MOS transistors M5 may be selected so that they provide an impedance match with the MOS transistors of commutating mixer switches 20 and 22 (e.g. MOS transistors M1-M4 of the commutating mixer switch in FIG. 2). Resistors R2 in combination with resistors R3 control the gain of the amplifier. Finally, an optional capacitor may be placed in parallel with each of the feedback loops containing the series combination of MOS transistor M5 and resistor R2 to form a first-order low-pass filter.

Figure 3A:
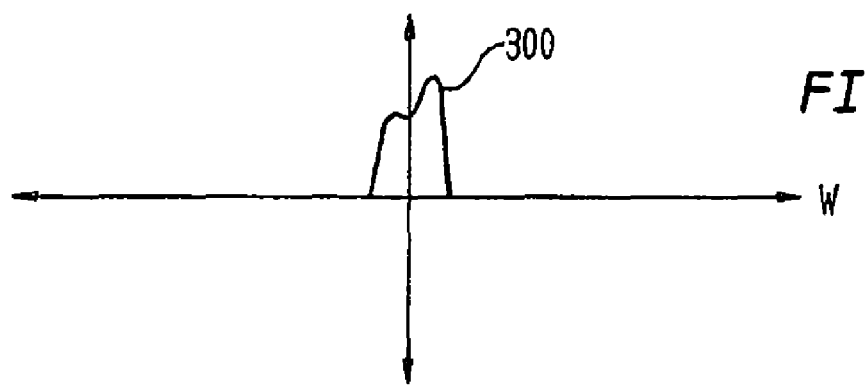
FIG. 3A shows the frequency spectrum of a baseband signal, which may be input into the exemplary image reject mixer shown in FIG. 1.

Referring now to FIG. 3A there is shown an illustration of a signal band spectrum 300, which may, for example, be mixed with (i.e. modulated by) the local oscillator signal, LO in the image reject mixer 10 in FIG. 1. FIG. B shows the output of the mixer, including a desired mixer output signal 310 and the rejected image signal 312, which may be present due to non-perfect image rejection.

Figure 3B:
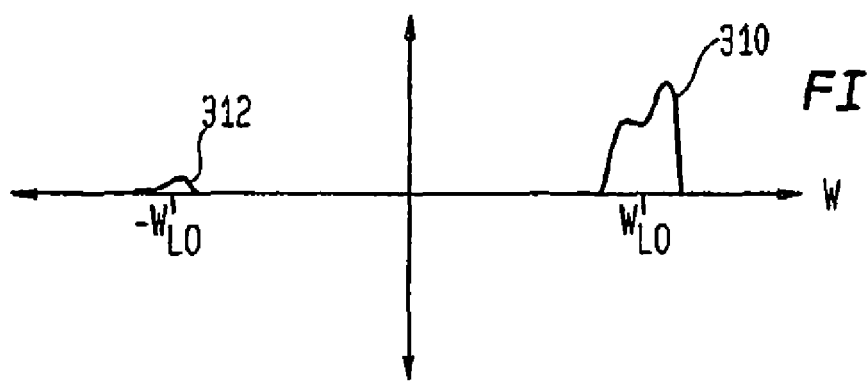
FIG. 3B shows the frequency spectra of the output of the exemplary image reject mixer shown in FIG. 1, including a desired mixer output signal and a rejected image signal.
Figure 4A:
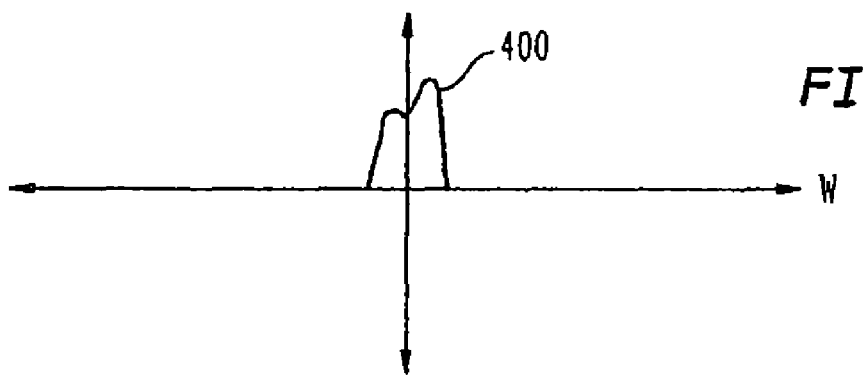
FIG. 4A shows the frequency spectrum of a baseband signal, which may be input into a modified version of the exemplary image reject mixer shown in FIG. 1.
Figure 4B:
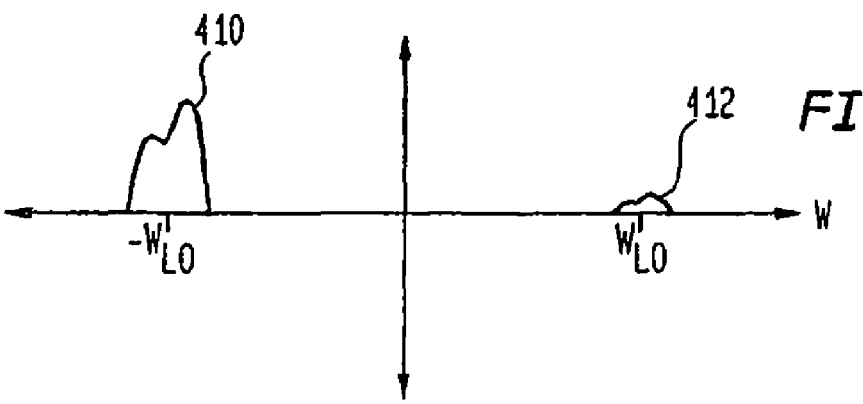
FIG. 4B shows the frequency spectra of the output of a modified version of the exemplary image reject mixer shown in FIG. 1, including a desired mixer output signal and a rejected image signal.

FIGS. 4A and 4B are similar to FIGS. 3A and 3B but correspond to a modified version (i.e. alternative embodiment) of the image reject mixer in FIG. 1, where the coupling of the differential output of quadrature phase commutating mixer switch 22 to the differential output of in-phase commutating mixer switch 20 is reversed such that the positive terminal of the differential output of quadrature phase commutating mixer switch 22 is coupled to the positive terminal of the differential output of in-phase commutating mixer switch 20 and the negative terminal of the differential output of quadrature phase commutating mixer switch 22 is coupled to the negative terminal of the differential output of in-phase commutating mixer switch 20. FIG. 4A shows a diagrammatic illustration of a signal band spectrum 400, which may, for example, be mixed with (i.e. modulated by) the local oscillator signal of the modified version of the image reject mixer in FIG. 1. FIG. 3B shows the output of the modified version of the image reject mixer in FIG. 1, including a desired mixer output signal 410 and the rejected image signal 412, which may be present due to non-perfect image rejection.

Figure 5:
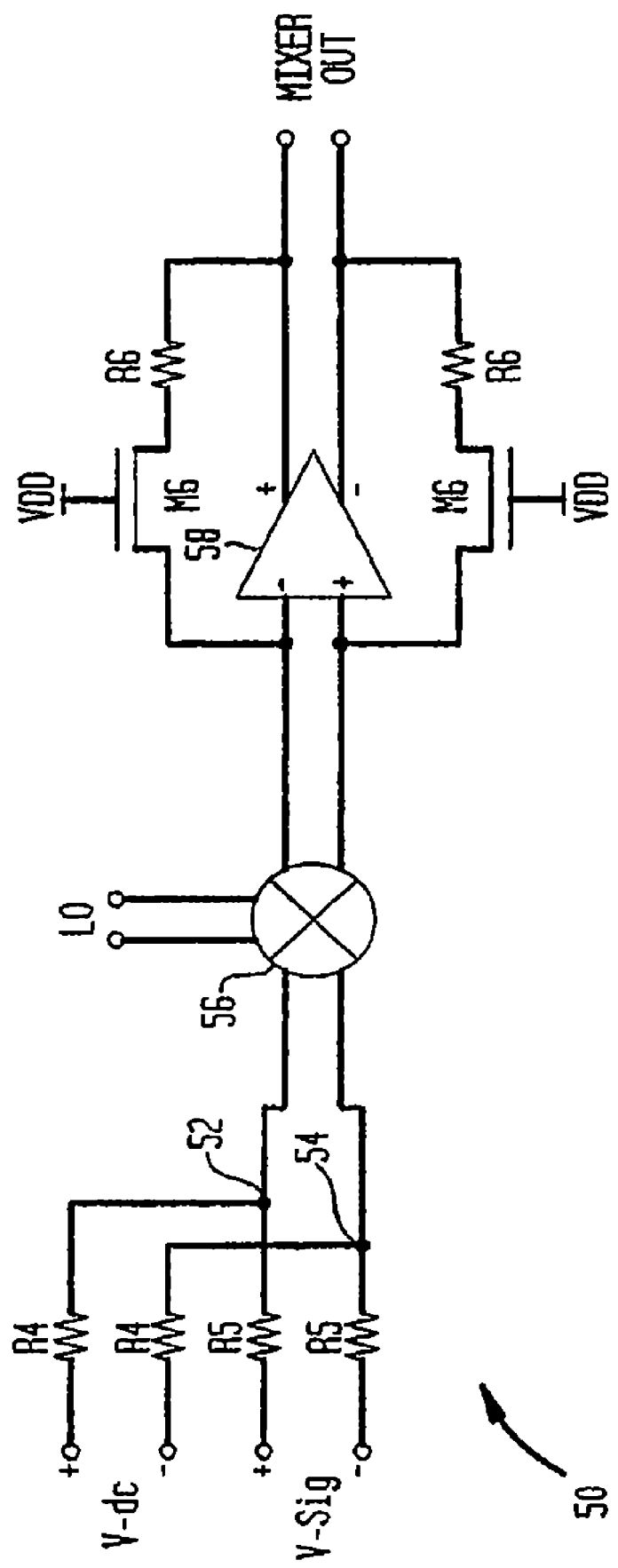
FIG. 5 shows an exemplary non-image reject mixer, according to an embodiment of the present invention.

The mixer in FIG. 1 is an image reject mixer. However, the present invention is not limited to image reject mixers. Indeed, the inventors of the present invention have contemplated that the DC offset calibration aspect of the present invention may apply to other non-image reject mixers just as well. Accordingly, FIG. 5 shows an exemplary non-image reject mixer 50 having DC offset calibration, according to another embodiment of the present invention. Resistors R4 (each R4 has the same resistance value) are configured to receive a differential offset compensation signal, V-dc, and resistors R5 (each R5 has the same resistance value) are configured to receive a main signal, V-sig. Unlike the prior art, with the use of the resistors, rather than reliance upon the on resistance of MOS transistors, the linearity of mixer 50 is superior. Resistors R5 function to convert main signal, V-sig, into currents, which are summed at nodes 52 and 54. Resistors R4 are selected to provide a DC offset cancellation path. A commutating mixer switch 56 is configured to receive the differential current signal from nodes 52 and 54, which is then modulated by a local oscillator signal, LO. An exemplary embodiment of a commutating mixer switch, which can be used for commutating mixer switch 56, is shown in FIG. 2. The differential output of commutating mixer switch 56 is coupled to the differential input of an operational amplifier 58. The positive end of the differential output of operational amplifier 58 is fed back to the inverting input of operational amplifier 58 and the negative end of the differential output of operational amplifier 58 is fed back to the non-inverting input of operational amplifier 58. Each of the feedback loops of operational amplifier 58 contains a resistor R6 (each R6 has the same resistance value) and a MOS transistor M6 (each M6 has substantially the same physical and electrical characteristics). The gates of both MOS transistors M6 are coupled to a power supply, VDD, so that they remain on and present themselves as resistive components. Also, the physical and material characteristics of both MOS transistors M6 may be selected so that they provide an impedance match with the MOS transistors of the commutating mixer switch 56 (e.g. MOS transistors M1-M4 of the commutating mixer switch in FIG. 2). Resistors R6 in combination with resistors R5 control the gain of the amplifier. Finally, an optional capacitor may be placed in parallel with each of the feedback loops containing the series combination of MOS transistor M6 and resistor R6 to form a first-order low-pass filter.

As explained above, another non-ideality that may be present in radio transceivers, and which can produce an undesirable DC component, is LO self mixing. According to another aspect of the present invention, therefore, a mixer having DC offset calibration for compensating for a DC component attributable to LO self mixing is provided. Both FIG. 1 and FIG. 5 may be modified to provide exemplary circuits capable of providing compensation for LO self mixing.

For example, the modification of FIG. 1 would entail substituting VI-dc with VI-LO and VQ-dc with VQ-LO, where VI-LO and VQ-LO are derived from the local oscillator signals, LO-I and LO-Q, respectively. To determine the DC components attributable to LO self mixing, each of the differential inputs can shorted and the output of the mixer measured, with LO-I and LO-Q alternately applied to the commutating mixer switch 66. Information provided by this measurement can be used to set the amplitude and/or phase of VI-LO and/or VQ-LO to compensate for any DC component added to the output due to LO self mixing.

Modification of the non-image reject mixer shown in FIG. 5 would be similar. In this case, V-dc would be replaced with V-LO. To determine the DC component attributable to LO self mixing, each of the differential inputs V-LO and V-sig are shorted and the output of the mixer is measured with the LO applied to the commutating mixer switch. Information provided by this measurement can then be used to set the amplitude and/or phase of V-LO, to compensate for any DC component added to the output because of LO self mixing.

Although the invention has been described in terms of a preferred methods and structure, it will be obvious to those skilled in the art that many modifications and alterations may be made to the disclosed embodiments without departing from the invention. For example, a PMOS transistor may be substituted for any of the NMOS transistors used in the embodiments shown in the figures with only minor modifications required to the biasing scheme. Accordingly, these and other modifications and alterations are intended to be considered as within the spirit and scope of the invention as defined by the appended claims.

What is claimed is:

1. An apparatus comprising:
   a first commutating mixer switch having a first input port configured to directly receive a first differential offset signal and having a first differential output port, wherein the first differential offset signal comprises a summation of a first current representative of a first input signal and a second current representative of a first DC offset signal; and
   a second commutating mixer switch having a second input port configured to directly receive a second differential offset signal and having a second differential output port, wherein the second differential offset signal comprises a summation of a third current representative of a second input signal and a fourth current representative of a second DC offset signal, wherein the first differential output port is coupled to the second differential output port to provide a combined differential output signal.

2. The apparatus of claim 1, further comprising:
   a first DC offset cancellation circuit configured to provide the first differential offset signal; and
   a second DC offset cancellation circuit configured to provide the second differential offset signal.

3. The apparatus of claim 2, wherein the first offset cancellation circuit comprises:
   a first resistor having a first end coupled to a first terminal of the first input port of the first commutating mixer switch and having a second end;
   a second resistor having substantially the same resistance value as the first resistor, the second resistor having a first end coupled to a second terminal of the first input port of the first commutating mixer switch and having a second end, wherein the second ends of the first and second resistors are coupled to the first input signal;
   a third resistor having a first end coupled to the first terminal of the first input port of the first commutating mixer switch and having a second end; and
   a fourth resistor having substantially the same resistance value as the third resistor, the fourth resistor having a first end coupled to the second terminal of the first input port of the first commutating mixer switch and having a second end, wherein the second ends of the third and fourth resistors are coupled to the first DC offset signal.

4. The apparatus of claim 2, wherein the second offset cancellation circuit comprises:
   a first resistor having a first end coupled to a first terminal of the second input port of the second commutating mixer switch and having a second end;
   a second resistor having substantially the same resistance value as the first resistor, the second resistor having a first end coupled to a second terminal of the second input port of the second commutating mixer switch and having a second end, wherein the second ends of the first and second resistors are coupled to second input signal;
   a third resistor having a first end coupled to the first terminal of the second input port of the second commutating mixer switch and having a second end; and
   a fourth resistor having substantially the same resistance value as the third resistor, the fourth resistor having a first end coupled to the second terminal of the second input port of the second commutating mixer switch and having a second end, wherein the second ends of the third and fourth resistors are coupled to the second DC offset signal.

5. The apparatus of claim 1, wherein the first differential output port comprises a first positive terminal and a first negative terminal and the second differential output port comprises a second positive terminal and a second negative terminal.

6. The apparatus of claim 1, wherein the first differential output port is connected to the second differential output port to provide the combined differential output signal.

7. A method comprising:
   directly receiving a first differential offset signal with a first commutating mixer switch, the first commutating mixer switch having a first differential output port, wherein the first differential offset signal comprises a summation of a first current representative of a first input signal and a second current representative of a first DC offset signal;

directly receiving a second differential offset signal with a second commutating mixer switch, the second commutating mixer switch having a second differential output port, wherein the second differential offset signal comprises a summation of a third current representative of a second input signal and a fourth current representative of a second DC offset signal; and combining a first signal from the first differential output port and a second signal from the second differential output port to provide a combined differential output signal.

8. The method of claim 7, further comprising:
amplifying the combined differential output signal with a differential amplifier.

9. The method of claim 8, wherein amplifying the combined differential output signal comprises:
providing a first feedback loop between a first terminal of a differential output of the differential amplifier and a non-inverting input terminal of the differential amplifier; and
providing a second feedback loop between a second terminal of the differential output of the differential amplifier and an inverting input terminal of the differential amplifier.

10. The method of claim 7, wherein directly receiving the first differential offset signal comprises:
passing the first input signal through a resistor to generate the first current; and
summing the first current and the second current to generate a DC-calibrated signal.

11. The method of claim 7, wherein directly receiving the second differential offset signal comprises:
passing the second input signal through a resistor to generate the third current; and
summing the third current and the fourth current to generate a DC-calibrated signal.

12. A system comprising:
a DC offset cancellation circuit configured to provide a first differential offset signal and a second differential offset signal, wherein the first differential offset signal comprises a summation of a first current representative of a first input signal and a second current representative of a first DC offset signal, and wherein the second differential offset signal comprises a summation of a third current representative of a second input signal and a fourth current representative of a second DC offset signal;
a first commutating mixer switch having a first input port configured to directly receive the first differential offset signal and having a first differential output;
a second commutating mixer switch having a second input port configured to directly receive the second differential offset signal and having a second differential output port, wherein the first differential output port is coupled to the second differential output port to provide a combined differential output signal; and
a differential amplifier configured to receive the combined differential output signal and to output a DC-calibrated differential signal.

13. The system of claim 12, wherein the DC offset cancellation circuit comprises:
a first resistor having a first end coupled to a first terminal of the first input port of the first commutating mixer switch and having a second end;
a second resistor having substantially the same resistance value as the first resistor, the second resistor having a first end coupled to a second terminal of the first input port of the first commutating mixer switch and having a second end, wherein the second ends of the first and second resistors are coupled to the first input signal;
a third resistor having a first end coupled to the first terminal of the first input port of the first commutating mixer switch and having a second end;
a fourth resistor having substantially the same resistance value as the third resistor, the fourth resistor having a first end coupled to the second terminal of the first input port of the first commutating mixer switch and having a second end, wherein the second ends of the third and fourth resistors are coupled to the first DC offset signal;
a fifth resistor having a first end coupled to a first terminal of the second input port of the second commutating mixer switch and having a second end;
a sixth resistor having substantially the same resistance value as the fifth resistor, the sixth resistor having a first end coupled to a second terminal of the second input port of the second commutating mixer switch and having a second end, wherein the second ends of the fifth and sixth resistors are coupled to the second input signal;
a seventh resistor having a first end coupled to the first terminal of the second input port of the second commutating mixer switch and having a second end; and
an eighth resistor having substantially the same resistance value as the seventh resistor, the eighth resistor having a first end coupled to the second terminal of the second input port of the second commutating mixer switch and having a second end, wherein the second ends of the seventh and eighth resistors are coupled to the second DC offset signal.

14. The system of claim 12, wherein each of the first and second commutating mixer switches further comprises a local oscillator differential input port configured to receive a local oscillator signal.

15. The system of claim 12, wherein the differential amplifier further comprises a differential input coupled to the combined differential output signal and a third differential output configured to output the DC-calibrated differential signal.

16. The system of claim 15, wherein the differential amplifier further comprises:
a first feedback loop connected between a first terminal of the third differential output and a non-inverting input terminal of the differential amplifier; and
a second feedback loop connected between a second terminal of the third differential output and an inverting input terminal of the differential amplifier.

17. The system of claim 16, wherein the first feedback loop comprises a resistor and a device to pass a current through the resistor from the non-inverting terminal of the differential amplifier to the first terminal of the second differential output.

18. The system of claim 17, wherein the device comprises a MOS transistor having a gate terminal coupled to a power supply.

19. The system of claim 16, wherein the second feedback loop comprises a resistor and a device to pass a current through the resistor from the non-inverting terminal of the differential amplifier to the second terminal of the second differential output.

20. The system of claim 12, wherein the first differential output port is connected to the second differential output port to provide the combined differential output signal.

* * * * *